United States Patent [19]

Kruszewski

[11] Patent Number: 5,122,661
[45] Date of Patent: Jun. 16, 1992

[54] METHOD AND APPARATUS FOR TESTING INFRARED RADIATION DETECTORS

[76] Inventor: Louis V. Kruszewski, 1720 Iowa Ave., West Mifflin, Pa. 15122

[21] Appl. No.: 722,532

[22] Filed: Jun. 27, 1991

[51] Int. Cl.⁵ .................... G01D 18/00; G01R 31/02
[52] U.S. Cl. .................... 250/252.1; 250/341; 324/421
[58] Field of Search ........... 324/418, 421; 340/753; 250/252.1, 341

[56] References Cited

U.S. PATENT DOCUMENTS

| | | | |
|---|---|---|---|
| 3,217,243 | 11/1965 | Franklin | 324/421 |
| 3,795,863 | 3/1974 | Umeda et al. | 340/753 X |
| 3,816,812 | 6/1974 | Alber et al. | 324/421 X |
| 3,969,672 | 7/1976 | Wallander et al. | 340/753 X |
| 4,460,829 | 7/1984 | Settanni et al. | 250/342 |
| 4,885,463 | 12/1989 | Wellman et al. | 250/252.1 |
| 4,899,052 | 2/1990 | Lindquist | 250/342 |
| 4,912,331 | 3/1990 | Owers | 250/342 |
| 5,030,827 | 7/1991 | Powell | 250/338.1 |

FOREIGN PATENT DOCUMENTS

447771 12/1974 U.S.S.R. ................ 424/421

Primary Examiner—Constantine Hannaher
Assistant Examiner—Edward J. Glick
Attorney, Agent, or Firm—Carothers & Carothers

[57] ABSTRACT

A unit for testing infrared radiation detection units which incorporate relay contacts that are readily rendered defective by increasing resistance through use, thereby rendering the infrared radiation detection unit defective or inaccurate. As an example, such radiation detection units which are tested include hot metal detectors, loop controllers or scanners, and optical barrier units used in steel manufacturing. The testing unit includes an infrared radiation source for radiating infrared rays to an infrared radiation detector on a detection unit to be tested, and the testing unit further includes a relay contact resistance tester for measuring resistance of the relay contacts which is comprised of a plurality of light emitting diode indicators connected in parallel with each other through a resistor current divider network which is connected in series with a power source and the relay contact in the unit to be tested. The resistance values in this network are selected and arranged such that the light emitting diode indicators progressively and successively extinguish as the electrical resistance of a serially connected relay contact to be tested increases.

10 Claims, 1 Drawing Sheet

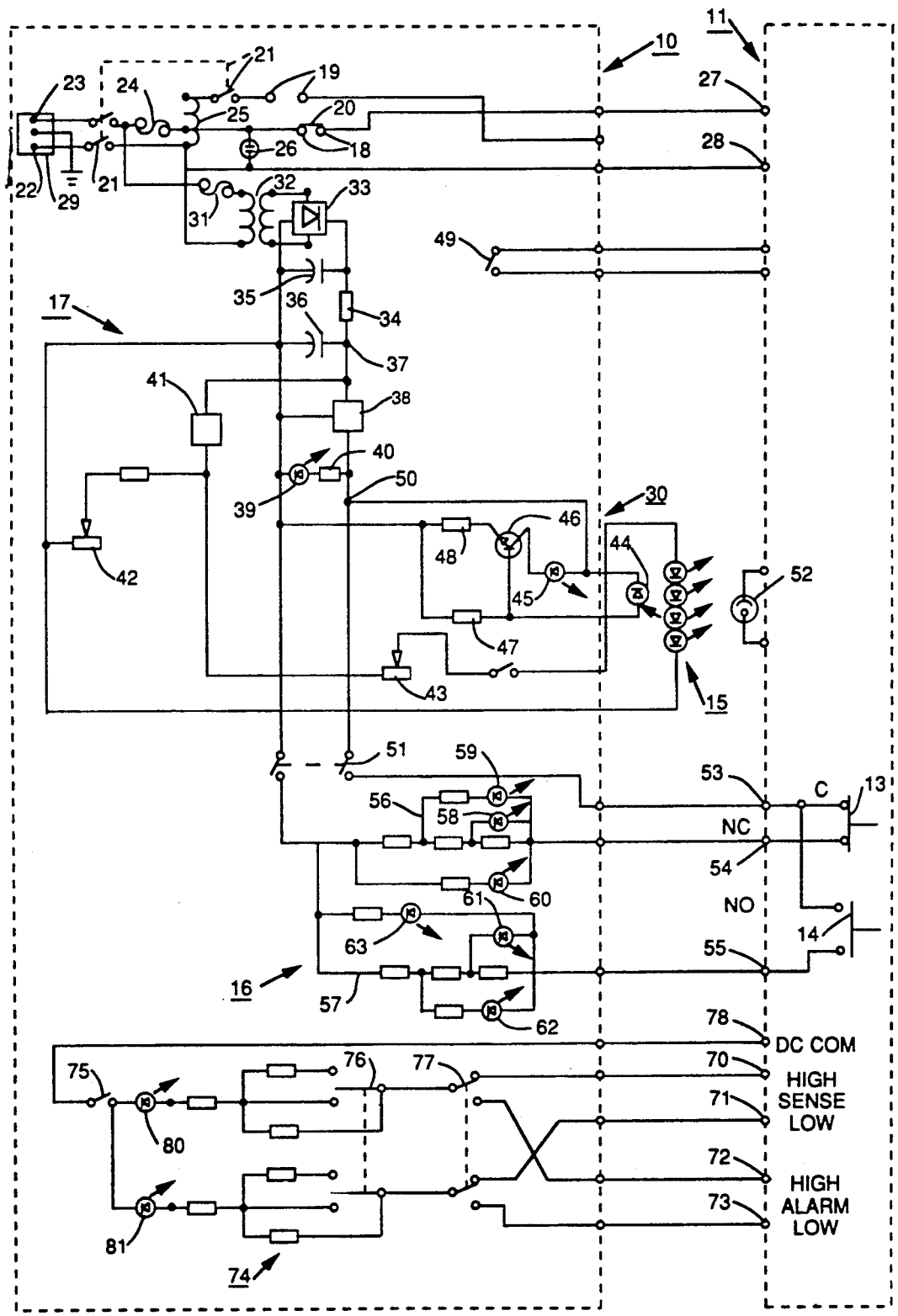

METHOD AND APPARATUS FOR TESTING INFRARED RADIATION DETECTORS

FIELD OF THE INVENTION

The present invention pertains generally to a method and apparatus for testing the functioning and credibility of infrared radiation detectors, and more particularly radiation detection units such as hot metal detectors, loop controllers or scanners, and optical barrier units used in steel manufacturing.

BACKGROUND OF THE INVENTION

In modern day steel mills or hot rolling mills the progress of the hot metal products being worked or conveyed must be closely monitored. This is normally accomplished by the use of detecting units which detect the infrared radiation radiated from the hot metal. As previously mentioned, such detectors might be hot metal detectors, loop controllers or scanners, or optical barrier units. It is obvious if these detection units should fail that dangerous working conditions can be created in the mill and a large amount of expensive damage can be done to the metal product and to the equipment.

It is therefore necessary to periodically test the accuracy or credibility of these infrared radiation detection units. Prior to the present invention, no universal test unit has been provided to easily and quickly test these infrared radiation detection units.

These infrared radiation detection units normally include a number of relays with relay contacts that carry heavy electrical currents. These relays are either energized or deenergized to indicate the presence of certain functions, such as the initial detection or presence of infrared radiation, the presence of alarm conditions and the like. Accordingly, over a period of time these relay contacts become corroded and/or burnt thereby creating unwanted electrical resistance between the engaging surfaces of the contacts. When this resistance becomes excessive, the infrared radiation detection unit will malfunction.

It is therefore desirable to have a universal test unit which will not only determine if the radiation detection unit is capable of detecting the presence of radiation in varying intensities but will also readily test all of the relay contacts within the detection unit and do so at low voltages and currents which will not create electrical hazzards to personnel.

SUMMARY OF THE INVENTION

The method and apparatus for testing infrared radiation detectors of the present invention incorporates all of these desired capabilities in a single unit package and generally comprises an infrared radiation source for radiating infrared rays to the infrared radiation detector on the detection unit to be tested. The testing unit also is provided with a means for detecting the relay contact resistances in the unit to be tested for measuring the electrical resistance of the relay contacts in a simple yet effective manner. The radiation detector unit of the present invention is provided with a low voltage and current electrical supply source which is a direct current and therefore nonhazardous for personal handling and this low voltage direct current source is connected in series with the relay contact resistance tester of the testing unit.

The relay contact resistance tester consists of a plurality of light emitting diodes or diode indicators connected in parallel with each other through a resistor current divider network such that the direct current source is connected in series with this network which makes up the relay contact resistance tester.

A relay contact in the unit to be tested is then connected in series with the direct current source and the relay contact resistant tester incorporating the current divider network and the light emitting diode indicators.

The resistance values of the current divider network are selected and arranged such that the light emitting diode indicators progressively and successively extinguish as the electrical resistance of the serially connected relay contact to be tested increases. By selecting the proper resistance values in the current divider network the testing unit provides an extremely accurate measurement or reading of the electrical resistance of each relay contact in the unit being tested as when each light emitting diode indicator extinguishes, it indicates an exact amount of resistance level obtained with high sensitivity.

Conventional ohm meters incorporating continuity testers in either the AC or DC modes in the form of audible beepers, or digital multimeters in the continuity test mode have disadvantages. Continuity testers which ultilize 110 V AC draw little current through their associated glow lamps and the use of 110 V AC for testing also presents a potential personal electrical hazard and a possible hazard to the unit under test.

On the otherhand, conventional continuity testers utilizing a 9 V DC supply and an audible buzzer or beeper to indicate continuity, will sound a continuity indication for resistance values of 100 ohms or less. However, when checking relay contacts in infrared radiation detection units, it is desirable to detect contact resistance values of 3 ohms or less.

The testing unit is also preferably provided with a light emitting indicator for connection to a unit to be tested to indicate and verify the presence of an infrared sense signal or an alarm signal to be generated by the unit to be tested. In this manner, the test unit not only has the capability of testing the resistance of the relay contacts in the unit to be tested but can also determine whether or not the unit is giving proper alarm signals when conditions are not correct and giving also proper sense signals when infrared radiation is being detected.

The testing unit of the present invention is also preferably provided with means to vary the intensity of the radiation radiating from the infrared radiation source. Generally, the infrared radiation source preferably includes one or more infrared radiating diodes which may be conventionally found on the market.

It is further preferable to also provide the testing unit with an infrared radiation detector for detecting the presence of infrared radiation issuing not only from the infrared radiation source of the testing unit itself but also from any other source.

BRIEF DESCRIPTION OF THE DRAWING

These and other objects and further advantages of the invention will be more readily understood upon consideration of the following detailed description and the accompanying drawing which is an electric schematic diagram illustrating a preferred embodiment of the method and apparatus of the present invention.

DESCRIPTION OF THE PREFERRED EMBODIMENT

Referring to the FIGURE, the testing unit 10 of the present invention is provided for testing the infrared radiation detection unit 11 which incorporates normally closed and normally open relay contacts 13 and 14 respectively.

The testing unit 10 is generally comprised of an infrared radiation source 15, consisting of a series connection of four infrared radiating diodes, such as model ECG 3017 diodes, a relay contact resistance testing circuit 16 and an electrical power supply 17.

The testing unit 10 may be supplied from a conventional AC power supply such as a 110 V 60 Hz source, which may also be utilized for energizing the unit 11 being tested through the testing unit 10.

This particular testing unit 10 is provided with an AC connector 29 for connection to a 110 V AC source (not shown). The selection is also made within testing unit 10 by selectively installing insulated jumper wires between contacts 18 and/or 19.

For 110 V operation a jumper 20 is installed or connected between contacts 18 as indicated and contacts 19 are left open. For 220 V operation, an additional jumper wire would also be shorted across contacts 19. The unit 10 is energized in the usual manner through the use of an AC power switch 21.

It should also be realized that instead of using the insulated jumper at contacts 18 or 19, one may also connect an AC ammeter or other suitable AC current measuring device to these contacts for continuous measurement of current.

With 110 V 60 Hz operation, a conventional 110 V AC source is applied between terminals 22 and 23 of connector 29. The middle terminal is chasis ground. When switch 21 is closed power is supplied through fuse 24 to the primary of auto transformer 25 and to one side of neon indicator 26 and then through contacts 18 via jumper 20 to terminal 27 of the unit 11 to be tested.

All AC return is from terminal 28 of unit 11 to the other side of indicator 26 and auto transformer 25 and on through the lower contact of switch 21 for return to the AC source.

For 220 V AC operation, power would also come from the secondary transformer 25 through a jumper (not shown) which would be shorted between contacts 19.

This AC power supply thus may be utilized to supply the energization to the radiation unit 11 to be tested through contacts 27 and 28 and it is also utilized to supply energization to the DC power supply 17 of the testing unit 10 itself.

A low voltage DC supply, such as 5 volts, is utilized in testing unit 10 to supply power to the relay contact resistance tester or test means 16 and to also supply power to a radiation detection circuit 30. To accomplish this, the 110 V AC power supplied from contacts or terminals 22 and 23 of connector 29 is supplied through fuse 31 to isolation transformer 32 and on to rectifier bridge 33 which in a conventional manner provides coarse direct current at the output thereof which is filtered in a conventional manner through the RC network consisting of resistor 34 and electrolytic capacitors 35 and 36, which provide a filtered DC output at point 37 of approximately 13 V DC.

This filtered DC is then applied to the input of voltage regulator 38 which might conventionally be a model 7805. The output of voltage regulator 38 is a regulated 5 VDC and is connected to light emitting diode 39 via current limiting resistor 40 to indicate the presence of the 5 VDC. This 5 V supply is then utilized to energize infrared radiation detection circuit 30 and the relay contact resistance test circuit 16, which will both be described in greater detail hereinafter.

Infrared radiation source 15 of testing unit 10 is also supplied from the rectified and filtered AC at point 37 and this DC voltage is further applied to variable voltage regulator 31 which might typically be an LM 317 model variable voltage regulator.

The output of regulator 31 is adjusted to a desired DC current output of say 170 mA by vernier variable resistor 42. This adjustment is made when vernier variable resistor 43 is positioned fully counterclockwise.

The voltage at the output of regulator 41 would be approximately 5 V DC and supplies or energizes the four infrared radiation diodes 15 which might typically be selected as model ECG 3017 diodes. Vernier 43 may be utilized to monitor the testing unit 10's sensitivity to infrared radiation as detected through infrared radiation detection circuit 30.

Infrared radiation detection circuit 30 consists of infrared radiation detector diode 44, light emitting diode 45, transistor 46 and resistors 47 and 48.

As may be readily seen, this circuit is supplied for energization from the 5 V DC output from voltage regulator 38 indicated at 50.

Infrared radiation detection circuit 30 permits one to not only test to see whether or not the infrared radiation source 15 is functioning properly, it also permits one to detect infrared radiation from other sources.

The relay contact resistance test circuit 16 is also supplied from the output 50 of voltage regulator 38 through switch 51. Circuit 16 is utilized to test the condition of normally closed and normally opened relay contacts 13 and 14 in the infrared detection unit 11 being tested. These contacts will of course be operated by circuitry (not shown) within the unit 11 being tested upon detection or nondetection of different degrees of infrared radiation by infrared radiation photocell detector 52 or any other suitable infrared detector.

Switch 49 is used to simulate unit 11's own normally open test switch. Some units 11 to be tested already have their own built in test switch.

When switch 51 is closed a positive 5 VDC is applied through terminal 53 of unit 11 being tested, which is the common connection or terminal of unit 11 for the relay contacts 13 and 14.

Normally closed relay contact 13 provides an electrical return through terminal 54 to the relay contact resistant test circuit 16. In a similar manner, the DC supply voltage is also supplied to normally opened relay contact 14 of unit 11 through common terminal 53 and thence returned to test circuit 16 via terminal 55 of unit 11 under test when relay contact 14 is closed due to the sensing of infrared radiation and circuit activity (not shown) carried out within unit 11 to be tested.

It may therefore be readily observed that the DC electrical source supplied through switch 51 from voltage regulator 38 is connected in series with the respective relay contacts 13 and 14 to be tested and further in series with each of the relay contact resistance test circuits 56 and 57 which respectively test relay contacts 13 and 14 of unit 11 and in combination make up test circuit 16.

The respective contact resistance test circuits 56 and 57 are comprised of a plurality of light emitting diode indicators designated 58, 59 and 60 in circuit 56 and 61, 62 and 63 in circuit 57. Both of these circuits 56 and 57 operate identically and therefore the operation of only circuit 56 will be discussed.

As may be readily seen, these light emitting diode indicators 58, 59 and 60 are connected in parallel with each other through a resistor current divider network and the resistance values of each of the 5 resistors shown in this network is selected such that the light emitting diode indicators progressively and successively extinquish as the electrical resistance of the serially connected relay contact 13 under test increases.

Since each of these test circuits 56 and 57 utilize 5 VDC at 204 mA, there is little chance of accidentally causing any damage to the unit 11 under test and there is also no chance of creating personal injury.

Any significant resistance in the relay contacts 13 and 14 under test will be indicated by the light emitting diodes. For example, if the resistance of relay contact 13 is below 3 ohms, light emitting diodes 58, 59 and 60 will all be lit indicating a resistance below 3 ohms.

If normally closed relay contact 13 has a resistance value which exceeds 3 ohms, light emitting diode 58 will extinquish and light emitting diodes 59 and 60 will remain lit.

For a contact resistance which is above 35 ohms, light emitting diode 59 will also extinquish and light emitting diode 60 will be the only one which remains lit.

When the contact resistance goes above 70 ohms, all three light emitting diodes 58, 59 and 60 will be extinquished.

This accordingly provides a very quick and accurate indication of the condition of the relay contacts 13 and 14 without the inherent disadvantages of other methods as previously described.

Most infrared radiation detection units 11 also sense when the radiation is present or not present, thus indicating a high or low condition and they also sense emergency conditions and thereby give off an alarm signal which is also in the form of either a high or low signal. This sense signal is issued by a properly working infrared radiation detection unit 11 at terminals 70 and 71. If a high sense signal is being issued it is issued from contact 70 and a low sense signal is sensed or issued from contact 71.

In similar manner if an alarm signal is present as indicated either by its presence as a high on terminal 72 and its absence as a low on terminal 73. The presence of these signals are tested and indicated by means of the signal test circuit 74.

Three switches 75, 76 and 77 control the operation of this signal testing circuit 74. Switch 75 connects signal DC power from DC common terminals 78 of the radiation detection unit 11 under test. This supply is utilized to energize circuit 74.

Switch 76 is a voltage selection switch which controls the DC voltage level that the test circuit 74 cannot accept. Voltages currently acceptable are 24, 12 and 5 VDC. By selecting either one contact position or other with switch 76, the current being supplied to light emitting indicating diodes 80 and 81 can be thus selectively controlled.

Switch 77 is used to select either the sensing of the sense signal from terminals 70 and 71 or for sensing the signal from the alarm terminals 72 or 73. In either position, the light emitting diode indicators 80 and 81 will indicate the presence or the lack of presence (a high or low) signal thereby varifying the correct operation of the sense and alarm conditions of the radiation detection unit 11 under test.

I claim:

1. An apparatus for testing infrared radiation detection units which incorporate relay contacts, comprising; an infrared radiation source for radiating infrared rays to an infrared radiation detector on a detection unit to be tested, relay contact resistance test means for measuring the electrical resistance of relay contacts in a detection unit to be tested, and electrical power supply means connected to energize said infrared radiation source and said relay contact resistance test means, said electrical source for said relay contact resistance means is a low voltage direct current connected in series with said relay contact resistance test means, said contact resistance test means connected in series with said source for series connection to a relay contact in a unit to be tested, said test means being comprised of a plurality of light emitting diode indicators, the lit quantity of which varies in proportion to the electrical resistance of a serially connected relay to be tested.

2. The testing apparatus of claim 1 wherein said plurality of light emitting diode indicators are connected in parallel with each other through a resistor current divider network, the resistance values in said network selected and arranged such that said light emitting diode indicators progressively and successively extinquish as the electrical resistance of a serially connected relay contact to be tested increases.

3. The testing apparatus of claim 2 including a light emitting indicator for connection to a unit to be tested to indicate and verify the presence of an infrared sense signal or an alarm signal to be generated by a unit to be tested.

4. The testing apparatus of claim 2 including means to vary the intensity of the radiation radiating from said radiation source.

5. The testing apparatus of claim 4 wherein said infrared radiation source includes at least one infrared radiating diode.

6. The testing apparatus of claim 2 including an infrared radiation detector for detecting the presence of infrared radiation issuing from said infrared radiation source or from some other source.

7. A method for testing infrared radiation detection units which incorporate relay contacts, comprising the steps of; generating infrared radiation and positioning the radiation for reception and detection by a unit to be tested, flowing a low voltage direct current through a relay contact in the unit to be tested, and measuring the electrical resistance of the contact.

8. The method of claim 7 wherein the step of measuring is carried out by utilizing a plurality of light emitting diodes connected in parallel in a resistor current divider network such that said light emitting diodes will progressively and successively extinquish as the electrical resistance of the contact being tested increases.

9. The method of claim 8 including the step of varying the intensity of the infrared radiation.

10. The method of claim 8 including the step of sensing the presence said infrared radiation.

* * * * *